United States Patent
Namuduri et al.

(10) Patent No.: US 11,810,873 B2
(45) Date of Patent: Nov. 7, 2023

(54) SOLID-STATE FUSE HAVING MULTIPLE CONTROL CIRCUITS

(71) Applicant: GM Global Technology Operations LLC, Detroit, MI (US)

(72) Inventors: Chandra S. Namuduri, Troy, MI (US); Muhammad H. Alvi, Troy, MI (US); Rashmi Prasad, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 255 days.

(21) Appl. No.: 17/224,736

(22) Filed: Apr. 7, 2021

(65) Prior Publication Data
US 2022/0328270 A1    Oct. 13, 2022

(51) Int. Cl.
*H01L 23/62*    (2006.01)
*H01L 23/525*    (2006.01)
*H01H 85/02*    (2006.01)

(52) U.S. Cl.
CPC .......... *H01L 23/62* (2013.01); *H01L 23/5256* (2013.01); *H01H 2085/0283* (2013.01)

(58) Field of Classification Search
None
See application file for complete search history.

(56) References Cited

U.S. PATENT DOCUMENTS

| | | | |
|---|---|---|---|
| 10,468,966 B1 * | 11/2019 | Mourrier | H03K 17/689 |
| 2011/0279152 A1 * | 11/2011 | Nakahara | H01L 27/088 |
| | | | 327/110 |
| 2014/0358352 A1 * | 12/2014 | Yamamoto | B60L 3/04 |
| | | | 701/22 |
| 2016/0211660 A1 * | 7/2016 | Laven | H01L 23/528 |
| 2017/0366180 A1 * | 12/2017 | Baburske | H01L 29/1608 |
| 2018/0109251 A1 * | 4/2018 | Djelassi | H03K 3/3565 |
| 2020/0403608 A1 * | 12/2020 | Kadavelugu | H02H 7/205 |
| 2022/0140769 A1 * | 5/2022 | Först | H02H 3/44 |
| | | | 318/445 |

FOREIGN PATENT DOCUMENTS

WO    WO-2020169765 A1 *    8/2020    ........... H02H 1/0007

* cited by examiner

*Primary Examiner* — Benjamin P Sandvik
(74) *Attorney, Agent, or Firm* — Vivacqua Crane, PLLC

(57) ABSTRACT

A solid-state fuse device includes a switch a gate driver connected to the switch and configured to transition the switch from a closed state to an open state when at least one of an overcurrent measurement exceeds a predetermined overcurrent threshold or a voltage drop across the switch exceeds a predetermined saturation voltage threshold.

15 Claims, 3 Drawing Sheets

SOLID-STATE FUSE HAVING MULTIPLE CONTROL CIRCUITS

INTRODUCTION

The present disclosure relates to a fuses, and more particularly to a resettable solid-state fuse.

An electrified vehicle powertrain may include an electrical system having separate high-voltage and low-voltage buses. While "high-voltage" and "low-voltage" are relative terms, "low-voltage" can encompass a maximum voltage level of twelve to fifteen volts, i.e., an auxiliary voltage, with the term "high-voltage" describing voltage levels well above auxiliary voltage levels. An electrified vehicle propulsion system, for instance, may have a maximum bus voltage ranging between sixty and three hundred volts, with certain emerging battery packs having a voltage capacity ranging between five hundred and eight hundred volts.

Strategically-positioned high-current fuses and high-voltage switches help ensure voltage isolation in the event of a fault condition within a high-voltage bus, with the switches also opened during routine shut down procedures. Fuses are circuit elements that can default to open circuit state in response to a threshold battery pack current.

SUMMARY

According to several aspects of the present disclosure, a solid-state fuse device includes a switch a gate driver connected to the switch and configured to transition the switch from a closed state to an open state when at least one of an overcurrent measurement exceeds a predetermined overcurrent threshold or a voltage drop across the switch exceeds a predetermined saturation voltage threshold.

In other features, the switch comprises a voltage-controlled switching device.

In other features, the voltage-controlled switching device comprises at least one of a silicon insulated gate bipolar transistor (IGBT), a metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

In other features, the solid-state fuse device comprises a current sensor connected between a traction battery and the switch, wherein the current sensor is configured to output an overcurrent signal indicative of an overcurrent measured by the current sensor.

In other features, the solid-state fuse device comprises a latch connected to an output of the current sensor, wherein the latch is configured to output a latch state signal indicative of a state maintained by the latch.

In other features, the latch is configured to transition from a first state to a second state when the overcurrent signal exceeds the predetermined overcurrent threshold and output the latch state signal indicative of the second state to disable the gate driver.

In other features, the latch is configured to transition from the second state to the first state after receiving a reset signal and output latch state signal indicative of the first state to enable the gate driver.

In other features, the electrical system comprises delay circuitry that is configured to output an overcurrent signal after a tunable delay time period.

In other features, the gate driver is configured to measure the voltage drop across the switch.

In other features, the switch is connected between a traction battery and a power inverter module.

According to several aspects of the present disclosure, a solid-state fuse device includes a switch a gate driver connected to the switch and configured to transition the switch from a closed state to an open state when at least one of an overcurrent measurement exceeds a predetermined overcurrent threshold or a voltage drop across the switch exceeds a predetermined saturation voltage threshold. The solid-state fuse device also includes a current sensor connected between a traction battery and the switch, wherein the current sensor is configured to output an overcurrent signal to the gate driver indicative of an overcurrent measured by the current sensor.

In other features, the switch comprises a voltage-controlled switching device.

In other features, the voltage-controlled switching device comprises at least one of a silicon insulated gate bipolar transistor (IGBT), a metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

In other features, the solid-state fuse device comprises a latch connected to an output of the current sensor, wherein the latch is configured to output a latch state signal indicative of a state maintained by the latch.

In other features, the latch is configured to transition from a first state to a second state when the overcurrent signal exceeds the predetermined overcurrent threshold and output the latch state signal indicative of the second state to disable the gate driver.

In other features, the latch is configured to transition from the second state to the first state after receiving a reset signal and output latch state signal indicative of the first state to enable the gate driver.

In other features, the gate driver is configured to measure the voltage drop across the switch.

In other features, the switch is connected between a traction battery and a power inverter module.

According to several aspects of the present disclosure, a solid-state fuse device includes a switch a gate driver connected to the switch and configured to transition the switch from a closed state to an open state when at least one of an overcurrent measurement exceeds a predetermined overcurrent threshold or a voltage drop across the switch exceeds a predetermined saturation voltage threshold. The solid-state fuse device also includes a current sensor connected between a traction battery and the switch, wherein the current sensor is configured to output an overcurrent signal to the gate driver indicative of an overcurrent measured by the current sensor and a latch connected to an output of the current sensor, wherein the latch is configured to output a latch state signal indicative of a state maintained by the latch.

In other features, the latch is configured to transition from a first state to a second state when the overcurrent signal exceeds the predetermined overcurrent threshold and output the latch state signal indicative of the second state to disable the gate driver.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Fuses are circuit elements that can transition from a closed state to an open state, e.g., an open circuit, to prevent current flow when current exceeds a certain threshold. Resettable fuses can transition between closed states and open states based on the current flow within an electrical system. For example, resettable fuses can transition to the open state to mitigate overcurrent faults within the electrical system.

A solid-state fuse device is disclosed that can include multiple control circuits. For example, a solid-state fuse device can include a switch a gate driver connected to the switch and configured to transition the switch from a closed state to an open state when at least one of an overcurrent measurement exceeds a predetermined overcurrent threshold or a voltage drop across the switch exceeds a predetermined saturation voltage threshold. As discussed herein, an overcurrent can be measured via a current sensor and the voltage drop can be measured across the switch terminals. Thus, the solid-state fuse device can distinguish between short circuit faults and overcurrent events.

Figure 1:
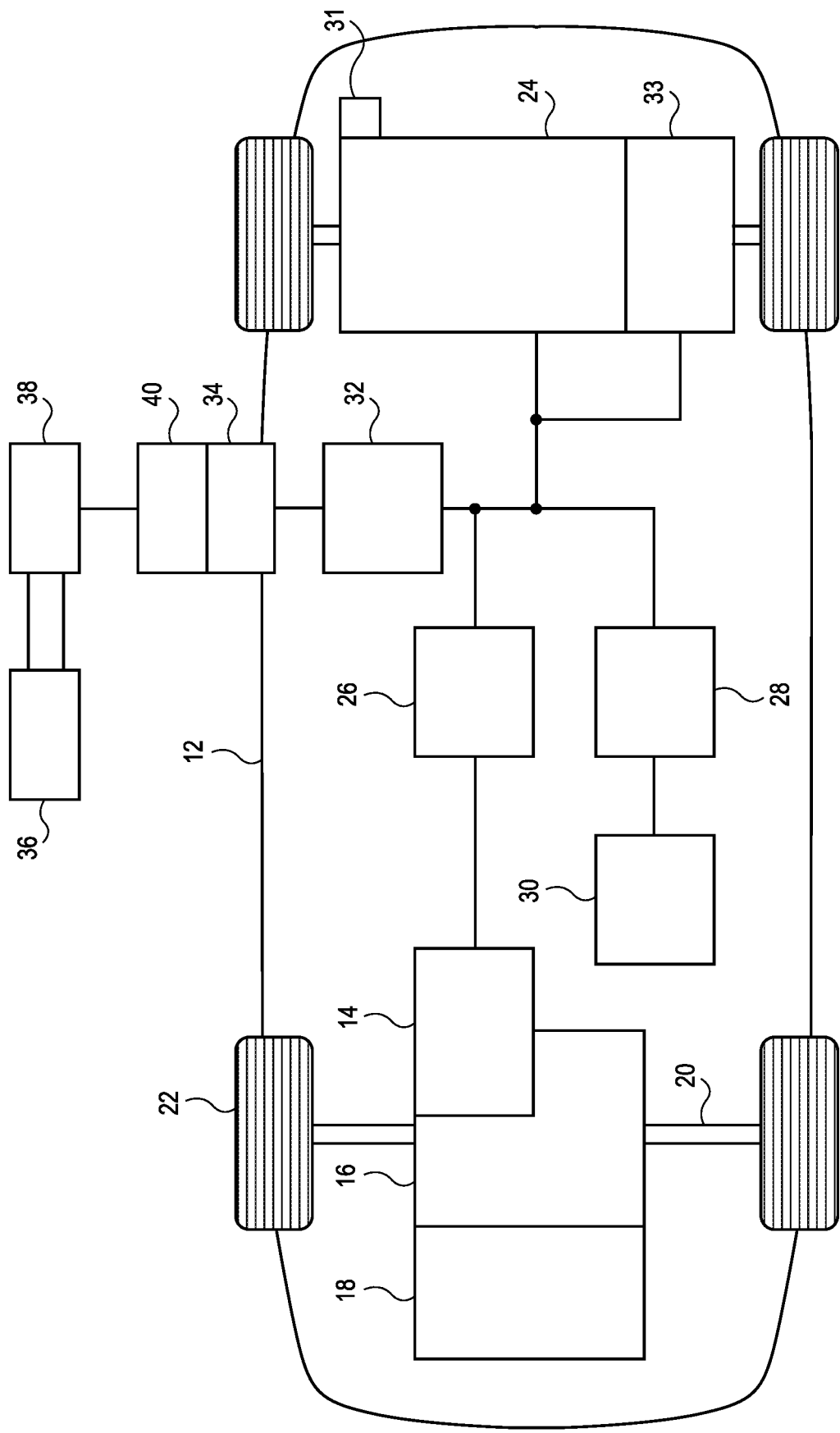
FIG. 1 is a schematic diagram of an example battery electric vehicle according to an example implementation.

FIG. 1 depicts a schematic of an example of a plug-in hybrid-electric vehicle (PHEV). A vehicle 12 may include one or more electric machines 14 mechanically connected to a hybrid transmission 16. The electric machines 14 may be capable of operating as a motor and/or a generator. In addition, the hybrid transmission 16 can be mechanically connected to an engine 18. The hybrid transmission 16 can also be mechanically connected to a drive shaft 20 that is mechanically connected to the wheels 22. The electric machines 14 can provide propulsion and deceleration capability when the engine 18 is turned on or off. The electric machines 14 may also function as generators and can provide fuel economy benefits by recovering energy that would normally be lost as heat in the friction braking system.

A traction battery 24, e.g., a battery pack, stores and provides energy that can be used by the electric machines 14 or other vehicle 12 components. The traction battery 24 typically provides a high voltage DC output from one or more battery cell arrays, sometimes referred to as battery cell stacks, within the traction battery 24. The high voltage DC output may also be converted to a low voltage DC output for applications such as vehicle stop/start. The battery cell arrays may include one or more battery cells. The traction battery 24 may be electrically connected to one or more power inverter modules 26 through one or more contactors. The one or more contactors isolate the traction battery 24 from other components when opened and connect the traction battery 24 to other components when closed. The power inverter module 26 is also electrically connected to the electric machines 14 and provides the ability to bi-directionally transfer electrical energy between the traction battery 24 and the electric machines 14. For example, a typical traction battery 24 may provide a DC voltage while the electric machines 14 may require a three-phase AC voltage to function. The power inverter module 26 may convert the DC voltage to a three-phase AC voltage as required by the electric machines 14. In a regenerative mode, the power inverter module 26 may convert the three-phase AC voltage from the electric machines 14 acting as generators to the DC voltage required by the traction battery 24. The description herein may be applicable to a pure electric vehicle or other hybrid vehicles. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical vehicle electrical system may include a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. In a typical vehicle, the low-voltage systems are electrically connected to an auxiliary battery 30, e.g., 12V battery.

A battery electrical control module (BECM) 33 may be in communication with the traction battery 24. The BECM 33 may function as a controller for the traction battery 24 and may also include an electronic monitoring system that manages temperature and charge state of each of the battery cells. The traction battery 24 may have a temperature sensor 31, such as a thermistor or other temperature gauge. The temperature sensor 31 may be in communication with the BECM 33 to provide temperature data regarding the traction battery 24. The temperature sensor 31 may also be located on or near the battery cells within the traction battery 24. It is also contemplated that more than one temperature sensor 31 may be used to monitor temperature of the battery cells.

The vehicle 12 may be, for example, an electric vehicle such as a PHEV, a FHEV, a MHEV, or a BEV in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of electrical energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34.

The various components discussed may have one or more associated controllers to control and monitor the operation of the components. The controllers may communicate via a serial bus (e.g., Controller Area Network (CAN)) or via discrete conductors.

The battery cells, such as a prismatic cell, may include electrochemical cells that convert stored chemical energy to electrical energy. Prismatic cells may include a housing, a positive electrode (cathode) and a negative electrode (anode). An electrolyte may allow ions to move between the anode and cathode during discharge, and then return during recharge. Terminals may allow current to flow out of the cell for use by the vehicle. When positioned in an array with multiple battery cells, the terminals of each battery cell may be aligned with opposing terminals (positive and negative) adjacent to one another and a busbar may assist in facilitating a series connection between the multiple battery cells. The battery cells may also be arranged in parallel such that similar terminals (positive and positive or negative and negative) are adjacent to one another. For example, two battery cells may be arranged with positive terminals adjacent to one another, and the next two cells may be arranged with negative terminals adjacent to one another. In this example, the busbar may contact terminals of all four cells. The traction battery 24 may be heated and/or cooled using a liquid thermal management system, an air thermal management system, or other method as known in the art.

Figure 2:
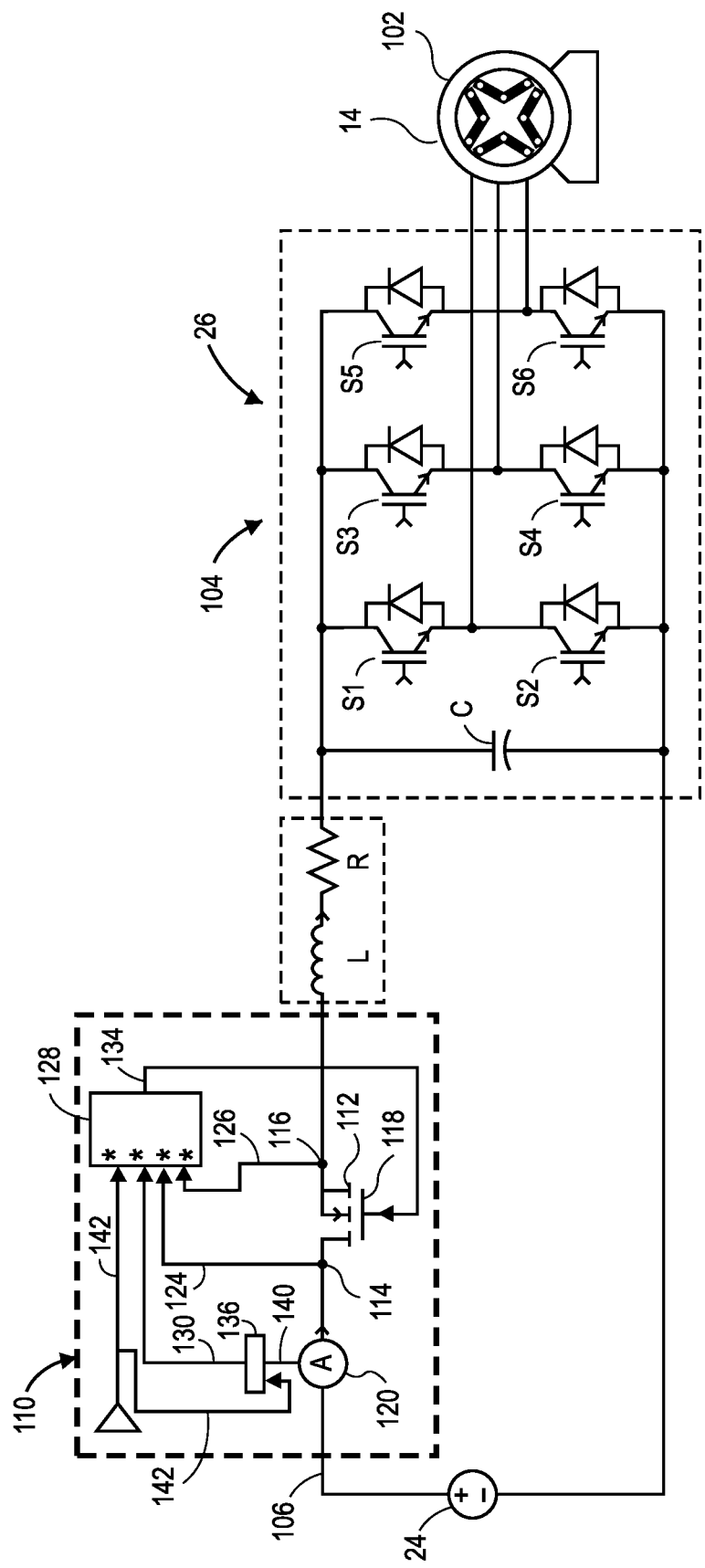
FIG. 2 is a circuit schematic of an electrical system of the electric vehicle according to an example implementation.

FIG. 2 illustrates an example electrical system 100 that includes the traction battery 24, the power inverter module 26, and the electric machine 14. In FIG. 2, the electric machine 14 is illustrated as a traction motor 102.

The power inverter module 26 may comprise a set 104 of semiconductor switches S1 through S6 (also referred to herein as "inverter switches") that cooperatively convert direct current (DC) power from the traction battery 24 to alternating current (AC) power for powering the traction motor 102 via high frequency switching during vehicle operation, e.g., a motoring mode of operation. Each semiconductor switch S1 through S6 may be embodied as a voltage-controlled switching device in the form of a silicon insulated gate bipolar transistor (IGBT), a silicon carbide (SiC) metal-oxide semiconductor field effect transistor (MOSFET), a silicon (Si) superjunction MOSFET, a Gallium nitride (GaN) field-effect transistor (FET), a SiC junction-gate field-effect transistor (JFET), other wideband-gap (WBG) or ultra-wideband-gap semiconductor power switching device (UWBG), or other suitable switch having a corresponding gate to which a gate signal is applied to change the on/off state of a given switch. There is typically at least one pair of semiconductor switches for each phase of the three-phase traction motor 102. Each pair of switches, e.g., switches S1 and S2 (Phase A), switches S3 and S4 (Phase B), and switches S5 and S6 (Phase C), may referred to as phase legs of the power inverter module 26. For example, the power inverter module 26 may include at least three (3) phase legs in an example implementation. Each phase leg of the power inverter module 26 is connected to a corresponding machine phase terminal of the traction motor 102. A DC link capacitor C can be connected across positive and negative connectors 106, 108 as illustrated in FIG. 2.

The electrical system 100 further includes a solid-state fuse device 110. As shown, the solid-state fuse device 110 can be connected between the traction battery 24 and the power inverter module 26. Reference characters L and R represent inductance and resistive circuit elements that can comprise an electrical connection between the solid-state fuse device 110 and the power inverter module 26. In example implementation, the electrical connection may comprise any suitable electrical connections, such as an electrical connector, e.g., an electrical cable.

The solid-state fuse device 110 can comprise a switch 112, such as a voltage-controlled switching device. Examples of voltage-controlled switching devices are described above with reference to the power inverter module 26. The switch 112 includes a first terminal 114, a second terminal 116, and a gate terminal 118. The first terminal 114 and the second terminal 116 can be arranged that the switch 112 is in series along the positive connector 106 to control current flow between the traction battery 24 and the power inverter module 26.

Operation of the solid-state fuse device 110 can be controlled by measuring two different current values. As described in greater detail herein, the solid-state fuse device 110 can measure overcurrent and can measure short circuit fault current through the through the electrical system 100. During operation, the solid-state fuse device 110 can allow current flow through the electrical system 100. However, in the event the solid-state fuse device 110 detects that at least one of the overcurrent or the short circuit fault current exceeds a predetermined current threshold, the solid-state fuse device 110 can prevent current flow until a reset signal is received.

The solid-state fuse device 110 can also include a current sensor 120. The current sensor 120 can be connected along the positive connector 106 and measure an amount of current passing through the positive connector 106. The solid-state fuse device 110 also includes a gate driver 128. The gate driver 128 can receive input from an output 130 of a latch 136 and terminals 124, 126 that are connected in parallel with the switch 112. As described in greater detail below, the latch 136 can provide an overcurrent signal indicative of an overcurrent signal measured by the current sensor 120. The gate driver 128 can measure a voltage drop across the switch 112 via the terminals 124, 126, which corresponds to the short circuit fault current as described in greater detail below. As shown, the first terminal 124 can be connected to the first terminal 114 of the switch 112, and the second terminal 126 can be connected to the second terminal 116.

The gate driver 128 can generate a control signal that controls operation of the switch 112 based on the received inputs as discussed in greater detail below. For example, the gate driver 128 may comprise a MOSFET driver that translates the received input signals to corresponding voltage signals that control operation of the switch 112. The switch 122 can transition between an open state, e.g., an off-state and a closed state, an on-state. In the open state, the switch 122 prevents current flow, and the switch 122 allows current flow in the closed state. The gate driver 128 can provide the control signal to the gate terminal 118 of the switch 122 via an output 134.

The current sensor 120 can comprise any suitable sensor that can directly measure current and generate a signal indicative of a measured overcurrent. The current sensor 120 can be configured to generate the overcurrent signal based on a predetermined current threshold, such as a predetermined value above a maximum operating current, which is provided to the latch 136.

In an example implementation, the latch 136 may comprise a flip-flop, such as a set-reset flip-flop. The latch 136 can receive, as input, the overcurrent signal from an output 140 of the current sensor 120. The latch 136 can also receive, at an input 142, a reset signal that causes a state stored by the latch 136 to transition. For example, initially, the latch 136 may be storing a first state in which a latch state signal indicative of the stored state is provided to the gate driver 128 via the output 130 to enable operation of the gate driver 128. The latch 136 can be configured to transition states based on the received overcurrent signal. For example, the latch 136 may transition from the first state to a second state when the overcurrent signal exceeds a predetermined overcurrent threshold. If the latch 136 transitions to the second state, the latch state signal transitions and can disable operation of the gate driver 128, e.g., causing the switch 112 to transition from the closed state to the open state. The latch 136 can provide the latch state signal that indicates the second state until the reset signal is received causing the latch 136 state to transition from the second state to the first state. The latch state signal can also transition to enable operation of the gate driver 128 to cause the switch 112 to transition from the open state to the closed state.

Figure 3:
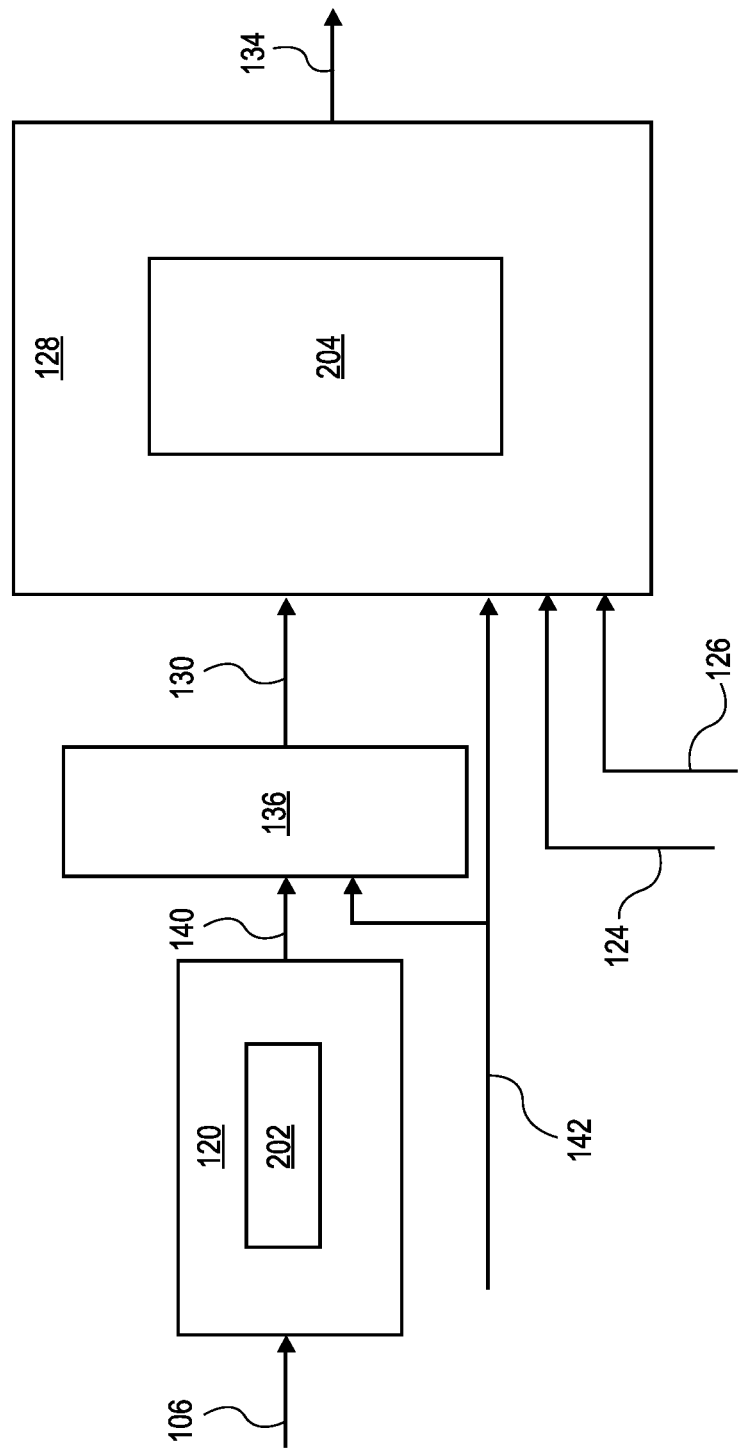
FIG. 3 is a diagram illustrating a solid-state fuse device of the electrical system according to an example implementation.

Referring to FIG. 3, the electrical system 100 can include delay circuitry 202 that can output the overcurrent signal after a delay time period. In an example implementation, the delay circuitry 202 outputs the overcurrent signal after the delay time period to the latch 136. In various implementations, the delay time period can range from about five (5) microseconds to about five hundred (500) milliseconds. By using the delay circuitry 202, selected inrush current profiles are allowed. For example, allowable inrush currents can be distinguished from overcurrent events and short circuit faults. In an example implementation, the delay circuitry 202 can comprise controllable delay circuitry 202 such that the delay time period is tunable, e.g., can be set. While illustrated as being included in the current sensor 120, it is understood that the delay circuitry 202 may be separate and/or distinct from the current sensor 120. For example, the delay circuitry 202 may be in series with the current sensor 120.

As described above, the gate driver 128 can measure the voltage drop across the switch 112 via the terminals 124, 126. The measured voltage drop can correspond to an amount of current flowing through the switch 112. In an example implementation, the gate driver 128 can include desaturation fault detection circuitry 204, e.g., DESAT detection circuitry, that can cause the switch 112 to transition from the closed state to the open state when the voltage drop exceeds a predetermined saturation voltage threshold, e.g., a DESAT voltage. The electrical system 100 may be experiencing excessive currents, such as load-shorting current, that can cause components of the electrical system 100 to break down when the voltage drop exceeds the DESAT voltage. As shown, the gate driver 128 can receive a reset signal via the input 142 that can cause the gate driver 128 and/or the desaturation fault detection circuitry 204 to output the control signal that transitions the switch 112 from the open state to the closed state.

It is understood that the reset signal may be provided by a number of vehicle 12 components. For example, in an example implementation, the reset signal may be provided by the battery electrical control module (BECM) 33. However, it is understood that the reset signal may be provided from any suitable vehicle 12 module, e.g., electronic control module.

It is understood that one or more thresholds corresponding to the current sensor 120 may differ with the one or more thresholds corresponding to the voltage drop across the switch 112. For example, the one or more thresholds corresponding to the voltage drop relate to a current level that is sustained for less than or equal to two (2) microseconds (us), and the one or more thresholds corresponding to the current sensor relate to a current level that is greater than the predetermined overcurrent threshold and is sustained for longer than the delay time period, e.g., the tunable delay time period.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A solid-state fuse device, comprising:
a switch having a first switch terminal, a second switch terminal, and a switch gate terminal;
a current sensor having a first current measuring port connected to a traction battery, a second current measuring port connected to the switch, and an overcurrent signal output port, wherein the current sensor is configured to output an overcurrent signal to the overcurrent signal output port in response to determining that an overcurrent has been measured by the current sensor for at least a tunable delay time period;
a latch having a first latch input port configured to receive a reset signal, a second latch input port connected to the overcurrent signal output port of the current sensor, and a latch output port, wherein the latch is configured to output a latch state signal indicative of a state maintained by the latch to the latch output port, and wherein the latch is configured to transition from a first state to a second state when the overcurrent signal exceeds a predetermined overcurrent threshold and output the latch state signal indicative of the second state to the latch output port; and
a gate driver having a first gate driver input port configured to receive the reset signal, a second gate driver input port connected to the latch output port, a third gate driver input port connected to the first switch terminal, a fourth gate driver input port connected to the second switch terminal, and a gate driver output port connected to the switch gate terminal, wherein the gate driver is configured to:
transition the switch from a closed state to an open state when an overcurrent measurement exceeds the predetermined overcurrent threshold for at least the tunable delay time period, wherein the overcurrent measurement is determined based at least in part on the latch state signal received at the second gate driver input port; and
transition the switch from the closed state to the open state when a voltage drop across the switch exceeds a predetermined saturation voltage threshold, wherein the voltage drop across the switch is determined based at least in part on a voltage difference between the third gate driver input port and the fourth gate driver input port; and
transition the switch from the open state to the closed state when the reset signal is received at the first gate driver input port.

2. The solid-state fuse device of claim 1, wherein the switch comprises a voltage-controlled switching device.

3. The solid-state fuse device of claim 2, wherein the voltage-controlled switching device comprises at least one of a silicon insulated gate bipolar transistor (IGBT), a metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

4. The solid-state fuse device of claim 3, wherein the latch is configured to transition from the second state to the first state after receiving the reset signal and output the latch state signal indicative of the first state to enable the gate driver.

5. The solid-state fuse device of claim 3, further comprising delay circuitry that is configured to output the overcurrent signal after the tunable delay time period.

6. The solid-state fuse device of claim 1, wherein the switch is connected between the traction battery and a power inverter module.

7. A solid-state fuse device, comprising:
a switch having a first switch terminal, a second switch terminal, and a switch gate terminal;
a current sensor having a first current measuring port connected to a traction battery, a second current measuring port connected to the switch, and an overcurrent signal output port, wherein the current sensor is configured to output an overcurrent signal to the overcurrent signal output port in response to determining that an overcurrent has been measured by the current sensor for at least a tunable delay time period;
a gate driver having a first gate driver input port configured to receive a reset signal, a second gate driver input port configured to receive the overcurrent signal, a third gate driver input port connected to the first switch terminal, a fourth gate driver input port connected to the second switch terminal, and a gate driver output port connected to the switch gate terminal, wherein the gate driver is configured to:
transition the switch from a closed state to an open state when an overcurrent measurement exceeds a predetermined overcurrent threshold for at least the tunable delay time period; and
transition the switch from the closed state to the open state when a voltage drop across the switch exceeds a predetermined saturation voltage threshold, wherein the voltage drop across the switch is determined based at least in part on a voltage difference between the third gate driver input port and the fourth gate driver input port; and
transition the switch from the open state to the closed state when the reset signal is received at the first gate driver input port.

8. The solid-state fuse device of claim 7, wherein the switch comprises a voltage-controlled switching device.

9. The solid-state fuse device of claim 8, wherein the voltage-controlled switching device comprises at least one of a silicon insulated gate bipolar transistor (IGBT), a metal-oxide semiconductor field effect transistor (MOSFET), a silicon superjunction MOSFET, a Gallium nitride (GaN) field-effect transistor (FET), a SiC junction-gate field-effect transistor (JFET), a wideband-gap (WBG) device, or an ultra-wideband-gap device (UWBG).

10. The solid-state fuse device of claim 7, further comprising a latch having a first latch input port configured to receive the reset signal, a second latch input port connected to the overcurrent signal output port of the current sensor, and a latch output port, wherein the latch is configured to output a latch state signal indicative of a state maintained by the latch to the latch output port.

11. The solid-state fuse device of claim 10, wherein the latch is configured to transition from a first state to a second state when the overcurrent signal exceeds the predetermined overcurrent threshold and output the latch state signal indicative of the second state to the latch output port.

12. The solid-state fuse device of claim 11, wherein the latch is configured to transition from the second state to the first state after receiving the reset signal and output the latch state signal indicative of the first state to the latch output port.

13. The solid-state fuse device of claim 7, wherein the switch is connected between the traction battery and a power inverter module.

14. A solid-state fuse device, comprising:
a switch having a first switch terminal, a second switch terminal, and a switch gate terminal;
a current sensor having a first current measuring port connected to a traction battery, a second current measuring port connected to the switch, and an overcurrent signal output port, wherein the current sensor is configured to output an overcurrent signal to the overcurrent signal output port in response to determining that an overcurrent has been measured by the current sensor for at least a tunable delay time period;
a latch having a first latch input port configured to receive a reset signal, a second latch input port connected to the overcurrent signal output port of the current sensor, and a latch output port, wherein the latch is configured to output a latch state signal indicative of a state maintained by the latch to the latch output port; and
a gate driver having a first gate driver input port configured to receive the reset signal, a second gate driver input port connected to the latch output port, a third gate driver input port connected to the first switch terminal, a fourth gate driver input port connected to the second switch terminal, and a gate driver output port connected to the switch gate terminal, wherein the gate driver is configured to:
transition the switch from a closed state to an open state when an overcurrent measurement exceeds a predetermined overcurrent threshold for at least the tunable delay time period, wherein the overcurrent measurement is determined based at least in part on the latch state signal received at the second gate driver input port; and
transition the switch from the closed state to the open state when a voltage drop across the switch exceeds a predetermined saturation voltage threshold, wherein the voltage drop across the switch is determined based at least in part on a voltage difference between the third gate driver input port and the fourth gate driver input port; and
transition the switch from the open state to the closed state when the reset signal is received at the first gate driver input port.

15. The solid-state fuse device of claim 14, wherein the latch is configured to transition from a first state to a second state when the overcurrent signal exceeds the predetermined overcurrent threshold and output the latch state signal indicative of the second state to the latch output port.

* * * * *